(12) United States Patent
Numata et al.

(10) Patent No.: US 12,255,297 B2
(45) Date of Patent: *Mar. 18, 2025

(54) BATTERY MONITORING SYSTEM

(71) Applicant: DENSO CORPORATION, Kariya (JP)

(72) Inventors: Tatsuhiro Numata, Kariya (JP); Shunichi Kubo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/413,965

(22) Filed: Jan. 16, 2024

(65) Prior Publication Data

US 2024/0154195 A1 May 9, 2024

Related U.S. Application Data

(63) Continuation of application No. 17/844,946, filed on Jun. 21, 2022, now Pat. No. 11,901,525, which is a
(Continued)

(30) Foreign Application Priority Data

Sep. 25, 2018 (JP) ................. 2018-179509

(51) Int. Cl.
*H01M 10/48* (2006.01)
*G01R 31/36* (2020.01)
*H01M 10/42* (2006.01)

(52) U.S. Cl.
CPC ...... *H01M 10/482* (2013.01); *G01R 31/3648* (2013.01); *H01M 2010/4271* (2013.01); *H01M 2010/4278* (2013.01)

(58) Field of Classification Search
CPC .. H01M 10/48; H01M 10/482; H01M 10/425; H01M 2010/4271; H01M 2010/4278; G01R 31/3648
See application file for complete search history.

(56) References Cited

U.S. PATENT DOCUMENTS 11,901,525 B2 * 2/2024 Numata ............ G01R 31/3648
2013/0026828 A1 1/2013 Twami
(Continued)

FOREIGN PATENT DOCUMENTS

JP 2009-148005 A 7/2009
JP 2014-127386 A 7/2014
(Continued)

OTHER PUBLICATIONS

Nov. 24, 2021 Office Action Issued in U.S. Appl. No. 16/576,968.
Mar. 21, 2022 Notice of Allowance issued in U.S. Appl. No. 16/576,968.

*Primary Examiner* — Christopher P Domone
(74) *Attorney, Agent, or Firm* — Oliff PLC

(57) ABSTRACT

In a battery monitoring system including a plurality of battery modules each including one or more cells, the battery modules are connected in series to each other. The battery monitoring system monitors the state of each cell based on the voltage value of the cell and the current value of the battery modules. A current detection unit detects the current value. Each voltage detection unit is associated with the corresponding one of the battery modules and detects the voltage value. Each slave unit is associated with the corresponding one of the battery modules, and wirelessly transmits information including synchronous current and voltage values detected by the current detection unit and the voltage detection unit. A master unit receives the information transmitted from the slave units. A central monitoring unit receives the information received by the master unit.

34 Claims, 7 Drawing Sheets

Related U.S. Application Data continuation of application No. 16/576,968, filed on Sep. 20, 2019, now Pat. No. 11,417,918.

(56) References Cited

U.S. PATENT DOCUMENTS

| | | | |
|---|---|---|---|
| 2015/0355286 A1* | 12/2015 | Kobayashi | H02J 7/0013 702/63 |
| 2016/0268642 A1 | 9/2016 | Yamazoe et al. | |
| 2017/0351561 A1 | 12/2017 | Yamazoe et al. | |
| 2018/0017627 A1 | 1/2018 | Shimizu | |
| 2019/0013664 A1 | 1/2019 | Yasunori | |
| 2019/0064458 A1 | 2/2019 | Otani et al. | |
| 2019/0067758 A1 | 2/2019 | Yamada | |
| 2019/0242949 A1 | 8/2019 | Lemkin et al. | |
| 2020/0064408 A1* | 2/2020 | Sato | H01M 10/482 |
| 2020/0099111 A1 | 3/2020 | Numata et al. | |
| 2022/0320612 A1 | 10/2022 | Numata et al. | |

FOREIGN PATENT DOCUMENTS

| | | |
|---|---|---|
| JP | 2016-109653 A | 6/2016 |
| JP | 2018-011454 A | 1/2018 |
| KR | 20070095612 A | 10/2007 |
| WO | 2016/072002 A1 | 5/2016 |
| WO | 2018/005631 A1 | 1/2018 |

* cited by examiner

FIG.4A
VOLTAGE ACQUISITION REQUEST (MCU)

FIG.4B
CURRENT DATA OUTPUT (CURRENT SENSOR)

FIG.4C
VOLTAGE ACQUISITION FLAG (CONTROL UNIT)

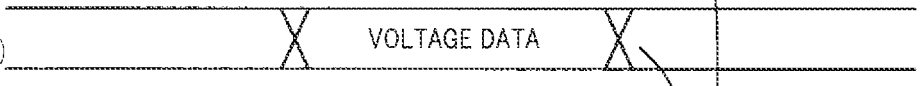

FIG.4D
VOLTAGE DATA OUTPUT (VOLTAGE DETECTION CIRCUIT)

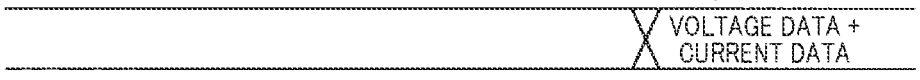

FIG.4E
STORING DATA (REGISTER)

FIG.5A
CURRENT AND VOLTAGE ACQUISITION REQUEST

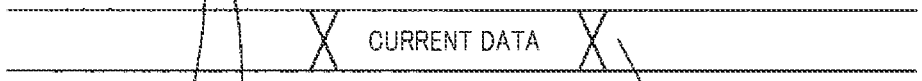

FIG.5B
CURRENT DATA OUTPUT (CURRENT SENSOR)

FIG.5C
CURRENT ACQUISITION FLAG (CONTROL UNIT)

FIG.5D
VOLTAGE ACQUISITION FLAG (CONTROL UNIT)

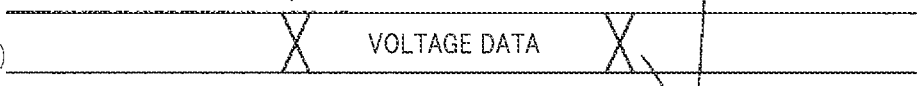

FIG.5E
VOLTAGE DATA OUTPUT (VOLTAGE DETECTION CIRCUIT)

FIG.5F
STORING DATA (REGISTER)

FIG.12
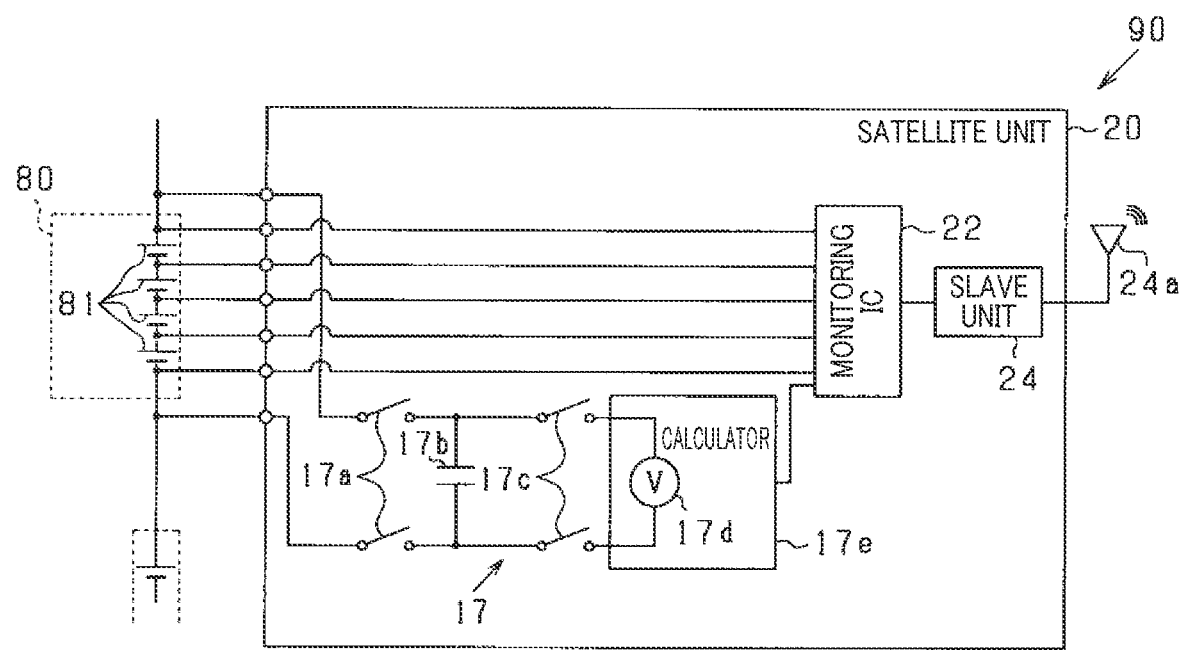
FIG.13A
FIG.13B
FIG.13C
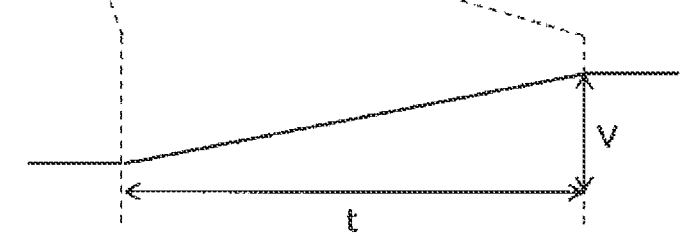

BATTERY MONITORING SYSTEM

CROSS-REFERENCE TO RELATED APPLICATION

This application is a continuation of U.S. patent application Ser. No. 17/844,946, filed Jun. 21, 2022, which is a continuation of U.S. patent application Ser. No. 16/576,968, filed Sep. 20, 2019, which is based on and claims the benefit of priority from earlier Japanese Patent Application No. 2018-179509 filed Sep. 25, 2018. The contents of those prior applications are incorporated by reference herein in their entireties.

BACKGROUND

Technical Field

This disclosure relates to a battery monitoring system for monitoring a plurality of battery modules each including a battery cell.

Related Art

A system is known that includes different battery cell managers provided for different battery modules, and a single battery manager serving the multiple battery cell managers. Each battery cell manager detects the voltage value of each battery cell included in the battery module associated with the battery cell manager, and wirelessly transmits the detected voltage value. The battery manager receives the voltage value wirelessly transmitted from each battery cell manager, and calculates the state of charge of the battery cell from the received voltage value and the current value of the battery cell, which is received in a different way.

BRIEF DESCRIPTION OF THE DRAWINGS

In the accompanying drawings:
FIGS. 4A to 4E are timing charts showing times to acquire voltage data and current data;
FIGS. 5A to 5F are timing charts showing times to acquire voltage data and current data in a modification;
FIG. 12 is a schematic diagram showing a battery monitoring system according to a seventh embodiment;
and
FIGS. 13A to 13C are graphs and a formula for describing a method of calculating a current value.

DESCRIPTION OF SPECIFIC EMBODIMENT

The known system, as disclosed in Japanese Patent No. 6093448, can have a smaller wiring space because each battery cell manager wirelessly transmits a voltage value. This contributes to space saving. In addition, even if an attempt at wireless communication fails under one condition, the system can retry the wireless communication under another condition. For example, the system can retry the wireless communication in a different frequency band or via a different wireless module to establish the wireless communication. However, retrying wireless communication may cause a difference between a voltage value detection time and a current value detection time. As a result, the voltage value and the current value may become out of synchronization. The failure of synchronization reduces the accuracy in the battery manager calculating the state of each battery cell, resulting in a rapid deterioration of the battery cell.

In view of the foregoing, it is desired to have a battery monitoring system that occupies less space saved and ensures the accuracy in calculation of the state of each battery cell.

Embodiments of the present disclosure will now be described with reference to the drawings. However, the present disclosure is not limited to the embodiments. The disclosure may be modified as appropriate without departing from the gist of the disclosure.

The terms "synchronous" and "substantially concurrent" as used herein mean that the difference between voltage value and current value detection times falls within a range that does not affect the accuracy in calculation of the internal resistance of each cell.

First Embodiment

Figure 1:
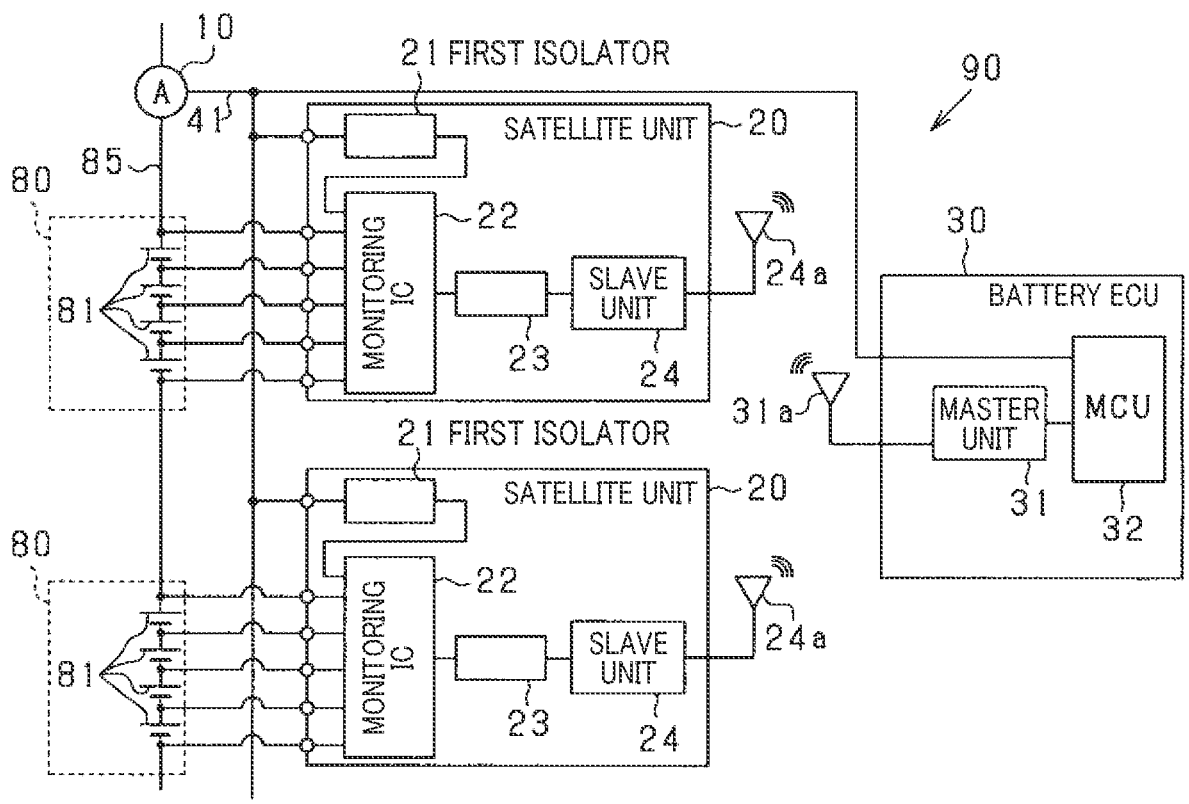
FIG. 1 is a schematic diagram showing a battery monitoring system according to a first embodiment.

FIG. 1 is a schematic diagram showing a battery monitoring system 90 according to the present embodiment. The battery monitoring system 90 monitors a plurality of battery modules 80. Each battery module 80 includes a plurality of cells 81 connected in series to each other through a series circuit 85. The battery modules 80 are also connected in series to each other through the series circuit 85. The battery monitoring system 90 includes a current sensor 10, a plurality of satellite units 20, and a battery electronic control unit (ECU) 30. The current sensor 10 and the satellite units 20 are cable-connected to each other via a cable 41 in a communicable manner. The cable 41 further connects the current sensor 10 and the battery ECU 30 in a communicable manner.

Figure 2:
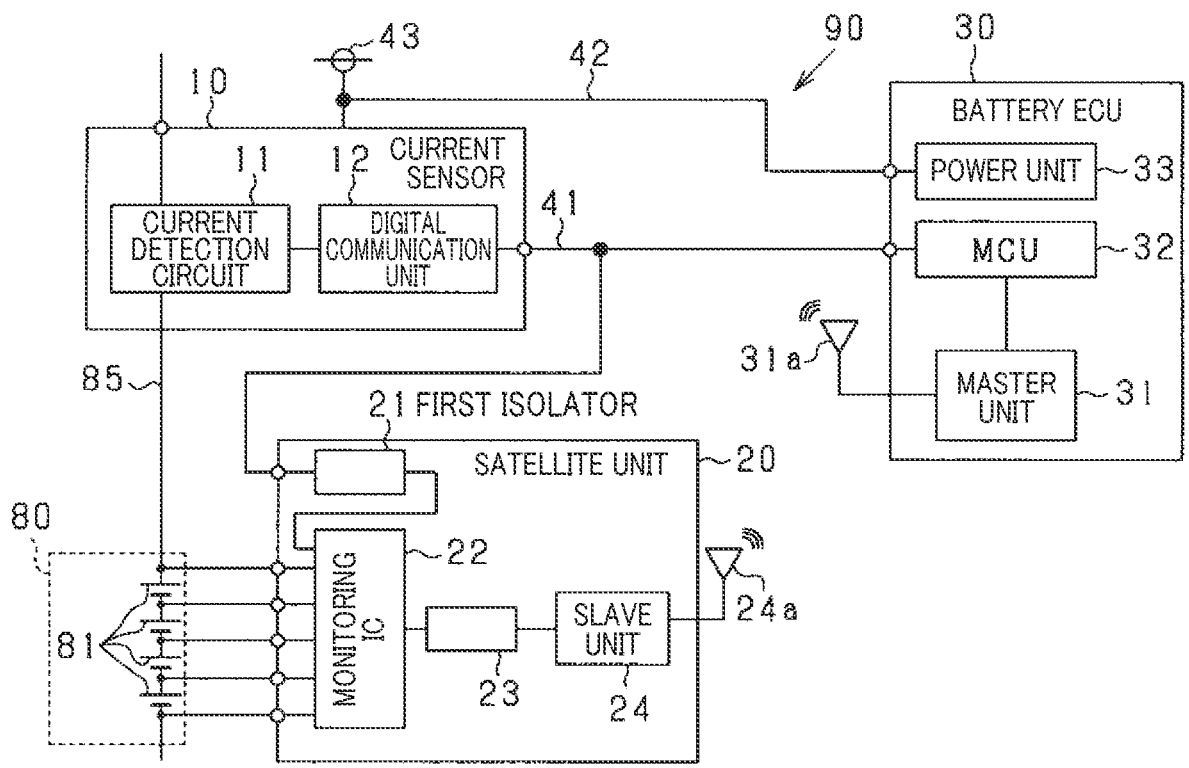
FIG. 2 is an enlarged view of a part of FIG. 1.

FIG. 2 is an enlarged view of a part of FIG. 1. In the present embodiment, the current sensor 10 corresponds to a current detection unit in the present disclosure. The single current sensor 10 serves the multiple satellite units 20. The current sensor 10 is connected to a power supply 43 via a line 42 and supplied with appropriate power from the power supply 43. The current sensor 10 includes a current detection circuit 11 and a digital communication unit 12. The current detection circuit 11 detects the value of a current flowing in the series circuit 85. The detection may be achieved by detecting the magnetic field intensity corresponding to the current value, in a state electrically isolated from the series circuit 85. The value of a current flowing in the series circuit 85 corresponds to the value of a current flowing in each battery module 80 and its cells 81. The digital communication unit 12 converts the current value detected by the current detection circuit 11 into a digital signal, and outputs the resultant digital signal. In the present embodiment, the current sensor 10 successively detects current values and outputs the values in the form of digital current data, or the signals representing the values. However, the current sensor 10 may detect a current value in response to a current acquisition request and output the value in the form of digital current data. In this case, the digital communication unit 12 receives a current acquisition request from a satellite unit 20.

Each satellite unit 20 is associated with the corresponding one of the battery modules 80. The satellite unit 20 includes a first isolator 21, a monitoring IC 22, a second isolator 23, and a slave unit 24. In the present embodiment, the monitoring IC 22 corresponds to a voltage detection unit in the present disclosure.

The digital communication unit 12 and each monitoring IC 22 are cable-connected to each other through the cable 41 and the first isolator 21 in a communicable manner. The first isolator 21 may be a magnetic coupler or a photocoupler. The first isolator 21 is installed to electrically isolate the digital communication unit 12, which has a low-voltage circuit, from the monitoring IC 22, which has a high-voltage circuit, and transfer current data.

The monitoring IC 22 receives current data via cable from the digital communication unit 12 as a digital signal through the first isolator 21. The monitoring IC 22 includes a voltage detection circuit, a register, and a control unit. The voltage detection circuit detects the voltage value (terminal voltage) of each cell 81 in the battery module 80. The register stores voltage data generated by converting a voltage value detected by the voltage detection circuit into a signal, current data received from the current sensor 10 via cable, and other data. The control unit controls the voltage detection circuit and the register.

The monitoring IC 22 and the slave unit 24 are cable-connected to each other through the second isolator 23 in a communicable manner. The second isolator 23 may be a magnetic coupler or a photocoupler. The second isolator 23 is installed to electrically isolate the monitoring IC 22, which has the high-voltage circuit, from the slave unit 24, which has a low-voltage circuit, and transfer voltage data and current data.

The slave unit 24 receives current data and voltage data in the form of digital signals from the monitoring IC 22 via cable through the second isolator 23. The slave unit 24 has an antenna 24a and causes the antenna 24a to wirelessly transmit the current data and the voltage data received via cable. The slave unit 24 also causes the antenna 24a to wirelessly receive an instruction from the battery ECU 30.

The battery ECU 30 includes a master unit 31, a micro controller unit (MCU) 32, and a power unit 33. In the present embodiment, the MCU 32 corresponds to a central monitoring unit in the present disclosure.

The master unit 31 has an antenna 31a and causes the antenna 31a to wirelessly receive current data and voltage data wirelessly transmitted from the slave units 24. The master unit 31 also causes the antenna 31a to wirelessly transmit an instruction to a satellite unit 20. The master unit 31 and the MCU 32 are cable-connected to each other in a communicable manner.

The MCU 32 uses voltage data and current data received through a slave unit 24 and the master unit 31 to calculate the internal resistance of the cells 81. Based on the internal resistance, the MCU 32 calculates the state of charge (SOC) of the cells 81. The MCU 32 also receives current data from the digital communication unit 12 through the cable 41, and calculates the sum of the current in the cells 81 from the current data.

The power unit 33 is connected to the power supply 43 via the line 42 and sends the power supplied from the power supply 43 to the MCU 32 and the master unit 31.

Figure 3:
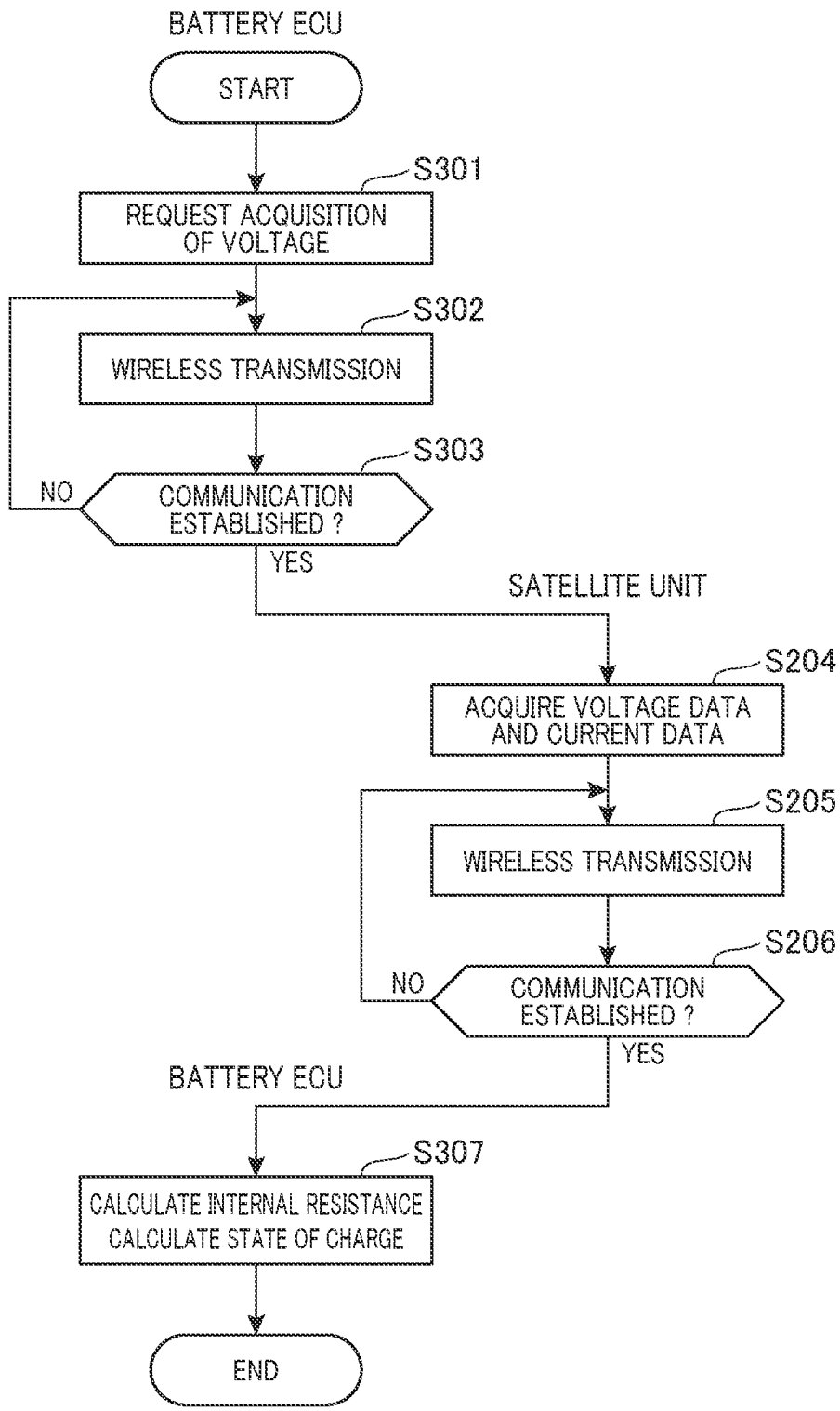
FIG. 3 is a flowchart showing the operation of the battery monitoring system.

FIG. 3 is a flowchart showing the operation of the battery ECU 30 and the satellite units 20. The battery ECU 30 causes the MCU 32 to generate a voltage acquisition request (S301), and wirelessly transmits the voltage acquisition request from the master unit 31 (S302). Then, the battery ECU 30 determines whether the wireless transmission has been received by each slave unit 24, or in other words, whether wireless communication has been established (S303). If no establishment is identified (S303: NO), the battery ECU 30 retries the wireless communication.

If the wireless communication is established (S303: YES), the satellite unit 20 acquires the voltage data on the cells 81 through the voltage detection circuit of the monitoring IC 22, and also acquires the synchronous current data from the current sensor 10 (S204). The voltage data and current data are stored in the register of the monitoring IC 22. The satellite unit 20 wirelessly transmits the acquired current data and voltage data from the slave unit 24 (S205). Then, the satellite unit 20 determines whether the wireless transmission has been received by the master unit 31, or in other words, whether wireless communication has been established (S206). If no establishment is identified (S206: NO), the satellite unit 20 retries the wireless communication.

If the wireless communication is established (S206: YES), the battery ECU 30 causes the MCU 32 to calculate the internal resistance of the cells 81 from the voltage data and the current data, and also calculate the state of charge of the cells 81 based on the internal resistance (S307).

FIGS. 4A to 4E are timing charts showing when the register acquires voltage data and current data in the present embodiment, in which the current sensor 10 successively outputs current data. More specifically, FIG. 4A is a timing chart showing turning on and off of a voltage acquisition request by the MCU 32. FIG. 4B is a timing chart showing output of current data by the digital communication unit 12. FIG. 4C is a timing chart showing turning on and off of a voltage acquisition flag by the control unit of the monitoring IC 22. FIG. 4D is a timing chart showing output of voltage data by the voltage detection circuit of the monitoring IC 22. FIG. 4E is a timing chart showing storing the voltage data and the current data in the register of the monitoring IC 22.

As shown in FIG. 4A, when the MCU 32 issues a voltage acquisition request (S301), the voltage acquisition request passes through the master unit 31 and the slave unit 24 (S302, S303), reaching the monitoring IC 22. As shown in FIG. 4C, the control unit of the monitoring IC 22 turns the voltage acquisition flag on. As a result, the voltage detection circuit of the monitoring IC 22 detects the voltage value of each cell 81 and outputs the corresponding voltage data, as shown in FIG. 4D. The voltage data and the synchronous current data in FIG. 4B output from the current sensor 10 are stored in the register of the monitoring IC 22 (S204), as shown in FIG. 4E. At this time, the control unit of the monitoring IC 22 determines an acquisition range of digital signals successively output from the current sensor 10 to set one frame of current data.

FIGS. 5A to 5F are graphs showing when the register acquires voltage data and current data in a modification of the present embodiment, in which the current sensor 10 detects a current value to output current data in response to a current acquisition request. More specifically, FIGS. 5A and 5B are timing charts corresponding to FIGS. 4A and 4B. FIG. 5C is a timing chart showing turning on and off of a current acquisition flag by the control unit of the monitoring IC 22. FIGS. 5D to 5F are timing charts corresponding to FIGS. 4C to 4E.

As shown in FIG. 5A, when the MCU 32 issues a current acquisition request and a voltage acquisition request (S301), the current acquisition request and the voltage acquisition request pass through the master unit 31 and the slave unit 24 (S302, S303), reaching the monitoring IC 22. As shown in FIG. 5C, the control unit of the monitoring IC 22 turns the current acquisition flag on, and as shown in FIG. 5D, turns the voltage acquisition flag on. As a result, the current sensor 10 detects the current value and outputs the corresponding current data as shown in FIG. 5B, while the voltage detection circuit of the monitoring IC 22 detects the voltage value of each cell 81 and outputs the corresponding voltage data as shown in FIG. 5E. The voltage data and the current data are stored in the register of the monitoring IC 22, as shown in FIG. 5F (S204).

According to the present embodiment, in which each slave unit 24 wirelessly transmits data to the master unit 31, the wiring space between the slave unit 24 and the master unit 31 can be reduced compared with a system that transmits data via cable. The slave unit 24, which receives voltage data and current data via cable, does not involve retrying failed wireless communication, unlike a unit that wirelessly receives such data. Accordingly, such a retry would not cause a difference between a voltage value detection time and a current value detection time. As a result, the voltage value and the current value can be synchronized. After that, even if wireless transmission fails and the wireless transmit is retried, the voltage value detection time and the current value detection time will not become out of synchronization. This enables the MCU 32 to calculate the internal resistance of each cell 81 with improved accuracy, thus enhancing the accuracy in calculation of the state of charge of the cells 81.

The use of the single current sensor 10 for the multiple satellite units 20 can simplify the structure of the battery monitoring system 90 and also reduce costs.

The monitoring IC 22 can integrate a current value and a voltage value because the monitoring IC 22 receives current data from the current sensor 10 via cable and transmits the current data and the voltage data on a detected voltage value to the slave unit 24 via cable. The series cable-connection between the current sensor 10 and the monitoring IC 22 simplifies the structure of the satellite unit 20.

The isolators 21 and 23, which transfer digital signals while providing isolation, permit a potential difference between the current sensor 10 and the slave unit 24, such as a voltage higher in the monitoring IC 22 than in the current sensor 10 or a voltage lower in the slave unit 24 than in the monitoring IC 22, as in the present embodiment.

Second Embodiment

A second embodiment of the present disclosure will now be described. In the present embodiment, components identical or similar to those in the first embodiment are designated by the same reference numerals, and differences from the first embodiment will be mainly described.

Figure 6:
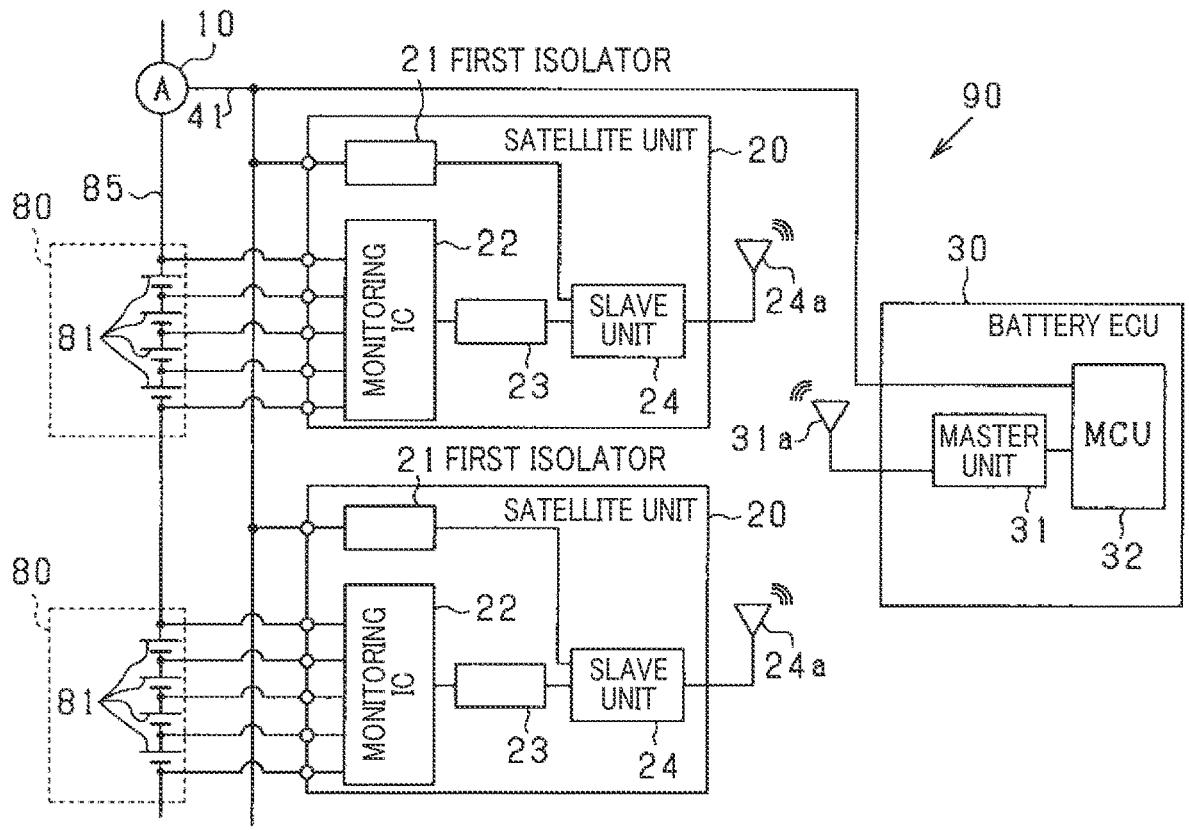
FIG. 6 is a schematic diagram showing a battery monitoring system according to a second embodiment.

FIG. 6 is a schematic diagram showing a battery monitoring system 90 according to the present embodiment. The current sensor 10 is cable-connected not to the monitoring IC 22 but to the slave unit 24 in a communicable manner. The first isolator 21 is installed between the current sensor 10 and the slave unit 24. The slave unit 24 thus receives voltage data from the monitoring IC 22 via cable, while receiving current data from the current sensor 10 via cable, not through the monitoring IC 22. The voltage data and the current data substantially concurrently detected by the current sensor 10 are stored in the register of the slave unit 24.

In the present embodiment, the slave unit 24 can integrate a current value and a voltage value. Furthermore, current data detected by the current sensor 10 can be directly transmitted to the slave unit 24 via cable, not through the monitoring IC 22. This makes it easy to wirelessly transmit voltage data in synchronization with current data in response to a voltage acquisition request, while successively transmitting current data to the battery ECU 30. This allows the MCU 32 to easily presume the current value synchronized with a voltage value by comparing the current values representing current data regularly received through the slave unit 24 and the master unit 31, with the current values representing current data received through the cable 41.

Third Embodiment

A third embodiment of the present disclosure will now be described. In the present embodiment, components identical or similar to those in the first embodiment are designated by the same reference numerals, and differences from the first embodiment will be mainly described.

Figure 7:
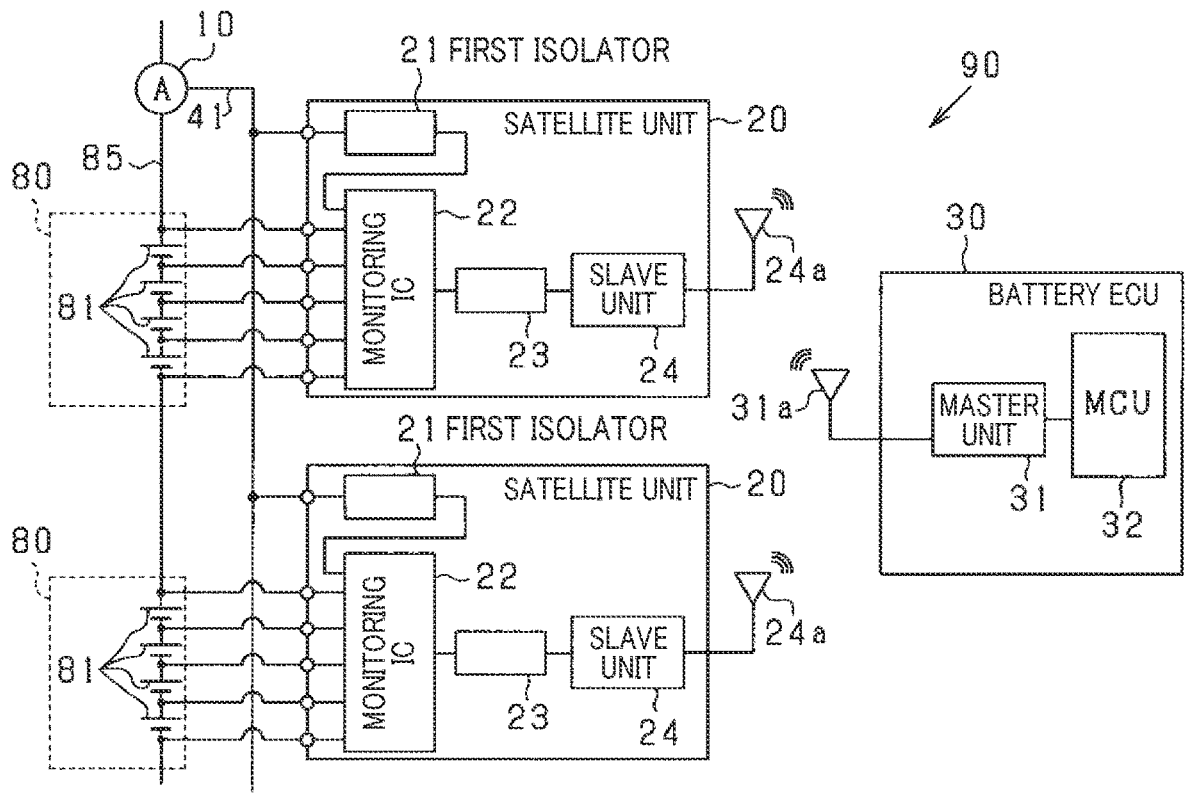
FIG. 7 is a schematic diagram showing a battery monitoring system according to a third embodiment.

FIG. 7 is a schematic diagram showing a battery monitoring system 90 according to the present embodiment. The cable 41 connects the current sensor 10 not to the battery ECU 30 but to each satellite unit 20. In other words, the battery monitoring system 90 has no path for carrying current data via cable from the current sensor 10 to the MCU 32. The MCU 32 thus calculates the sum of the current in the cells 81 based on current data wirelessly transmitted from different slave units 24 at different times.

Figure 8A:
FIGS. 8A to 8E are graphs showing current data transmission.
Figure 8B:
Figure 8C:
Figure 8D:
Figure 8E:

FIGS. 8A to 8E are graphs showing current data transmission and acquisition. More specifically, FIG. 8A is a graph showing an actual current flowing in the cells 81. FIG. 8B is a graph showing current values acquired by the battery ECU 30. FIGS. 8C to 8E are graphs showing current values acquired by different satellite units 20. Each satellite unit 20 acquires current data more frequently than voltage data, and wirelessly transmits the acquired current data to the battery ECU 30. Each satellite unit 20 and the other satellite units 20 acquire current data at different times, and wirelessly transmit the acquired current data to the battery ECU 30. The battery ECU 30 can receive current data acquired by the different satellite units 20 at different times, thus determining fluctuations in current values as shown in FIG. 8B.

In the present embodiment, the removal of the cable between the current sensor 10 and the MCU 32 can simplify the structure of the battery monitoring system 90 and also reduce costs. The MCU 32 can receive current data relatively frequently without being cable-connected to the current sensor 10 because each slave unit 24 wirelessly transmits current data more frequently than voltage data. The MCU 32 can receive current data relatively frequently without being cable-connected to the current sensor 10 also because each slave unit 24 and the other slave units 24 wirelessly transmit current data at different times. The MCU 32 can thus receive current data quite frequently. The received current data can be used to calculate the sum of the current in the cells 81.

Fourth Embodiment

A fourth embodiment of the present disclosure will now be described. In the present embodiment, components identical or similar to those in the first embodiment are designated by the same reference numerals, and differences from the first embodiment will be mainly described.

Figure 9:
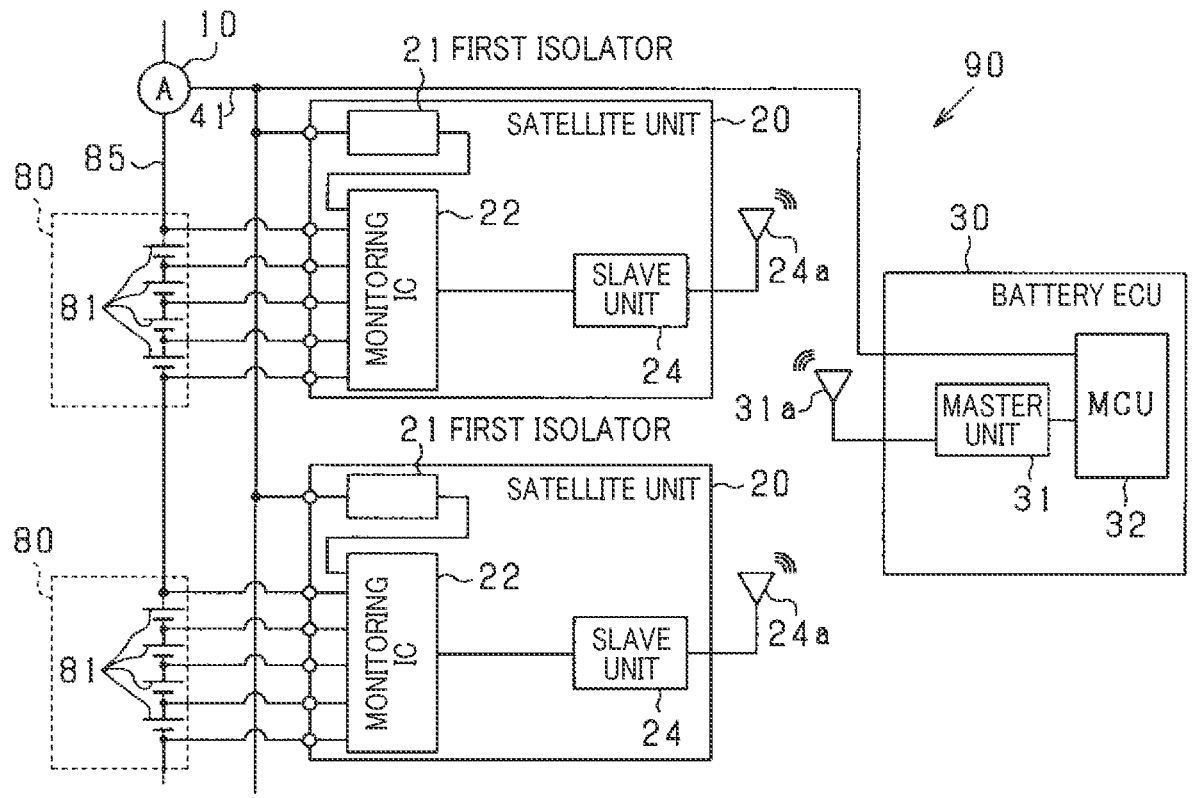
FIG. 9 is a schematic diagram showing a battery monitoring system according to a fourth embodiment.

FIG. 9 is a schematic diagram showing a battery monitoring system 90 according to the present embodiment. The monitoring IC 22 and the slave unit 24 have the same voltage. Thus, no second isolator 23 is installed between the monitoring IC 22 and the slave unit 24, with the monitoring IC 22 and the slave unit 24 directly cable-connected to each other. In the present embodiment, the second isolator 23 is not required, which allows the area of the substrate to be reduced, thus contributing to the reduction of costs.

Fifth Embodiment

A fifth embodiment of the present disclosure will now be described. In the present embodiment, components identical or similar to those in the first embodiment are designated by the same reference numerals, and differences from the first embodiment will be mainly described.

Figure 10:
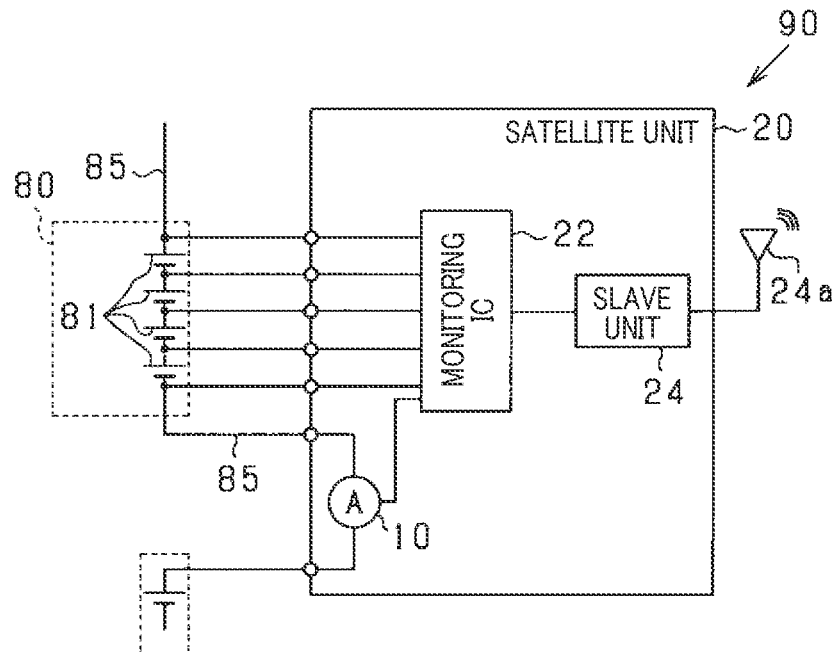
FIG. 10 is a schematic diagram showing a battery monitoring system according to a fifth embodiment.

FIG. 10 is a schematic diagram showing a battery monitoring system 90 according to the present embodiment. The current sensor 10 is installed in each satellite unit 20, or more particularly, provided for each slave unit 24. Each slave unit 24 receives current data via cable from the corresponding current sensor 10. More specifically, the monitoring IC 22 detects and turns voltage values into voltage data, and receives the substantially concurrently detected current data from the current sensor 10 via cable. The monitoring IC 22 transmits the voltage data and the current data to the slave unit 24 via cable.

In the present embodiment, the collection of voltage data and current data is completed within each satellite unit 20 because the current sensor 10 is installed in each satellite unit. This enables voltage values and current values to be easily synchronized with each other.

Sixth Embodiment

A sixth embodiment of the present disclosure will now be described. In the present embodiment, components identical or similar to those in the first and the fifth embodiments are designated by the same reference numerals, and differences from the fifth embodiment will be mainly described.

Figure 11:
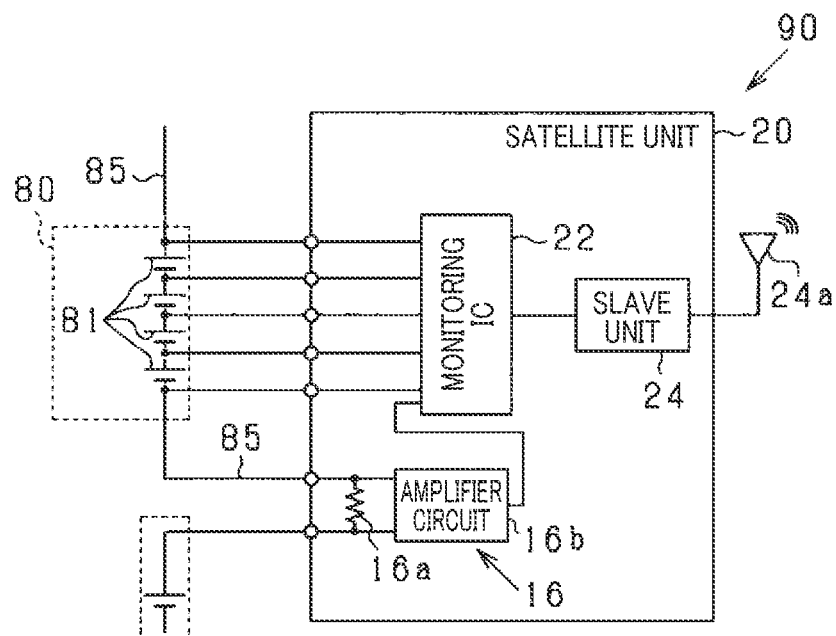
FIG. 11 is a schematic diagram showing a battery monitoring system according to a sixth embodiment.

FIG. 11 is a schematic diagram showing a battery monitoring system 90 according to the present embodiment. The battery monitoring system 90 in the present embodiment includes a current detection unit 16 in place of the current sensor 10. The current detection unit 16 includes a shunt resistor 16a, an amplifier circuit 16b, and a calculator. The shunt resistor 16a is connected in series to the battery modules 80. The amplifier circuit 16b amplifies the voltage difference across the shunt resistor 16a, as well as converts the amplified voltage signal into a digital signal and transmits the resultant signal to the calculator (the monitoring IC 22) via cable. The calculator is installed in the monitoring IC 22 and calculates a current value from the received digital signal. The accuracy in the current value detection can be enhanced by improving the calculation accuracy at the calculator. In the present embodiment, the non-necessity of the current sensor 10 can contribute to the reduction of costs.

Seventh Embodiment

A seventh embodiment of the present disclosure will now be described. In the present embodiment, components identical or similar to those in the first and the fifth embodiments are designated by the same reference numerals, and differences from the fifth embodiment will be mainly described.

FIG. 12 is a schematic diagram showing a battery monitoring system 90 according to the present embodiment. The battery monitoring system 90 in the present embodiment includes a current detection unit 17 in place of the current sensor 10 to acquire the voltage of the battery module 80 by the flying capacitor method. The current detection unit 17 includes a first switch 17a, a capacitor 17b, a second switch 17c, a voltage sensor 17d, and a calculator 17e. The calculator 17e is cable-connected to the monitoring IC 22 in a communicable manner. When the first switch 17a is closed, the capacitor 17b is connected in parallel with the battery module 80. When the first switch 17a is open, the parallel connection is released. When the second switch 17c is closed, the voltage sensor 17d is connected in parallel with the capacitor 17b. When the second switch 17c is open, the parallel connection is released.

The process of current value detection by the current detection unit 17 in the present embodiment will now be described. First, the first switch 17a and the second switch 17c are both open. In this state, the first switch 17a is closed for a predetermined period of time t to charge the capacitor 17b, and then the first switch 17a is opened again. In this state, the second switch 17c is then closed to detect the voltage V of the charged capacitor 17b. The capacitance of the capacitor 17b is denoted by C.

The calculator 17e then calculates a current value from the values t, C, and V. More specifically, with a current value denoted by i, the current value is calculated in accordance with the formula, i=CV/t. The accuracy in the current value detection can be enhanced by improving the calculation accuracy at the calculator 17e. FIG. 13A is a graph showing an actual current flowing in the cells 81. FIG. 13B is a graph showing voltages acquired by the capacitor 17b. FIG. 13C is the formula for calculating a current value.

The calculation result (current value) obtained at the calculator 17e is converted into a digital signal and then transmitted to the monitoring IC 22 via cable. In the present embodiment, the non-necessity of the current sensor 10 can contribute to the reduction of costs.

Other Embodiments

The embodiments may be modified as described below. For example, instead of wirelessly transmitting current data and voltage data from each slave unit 24 to the master unit 31, each satellite unit 20, or more specifically, the monitoring IC 22, the slave unit 24, and other calculators may calculate the internal resistance and the state of charge of the cells 81 from the current data and the voltage data, and wirelessly transmit the calculation result data from the slave unit 24 to the master unit 31.

In an example, instead of connecting the battery ECU 30 and the current sensor 10 via cable, the battery ECU 30 and the current sensor 10 may wirelessly communicate with each other. In another example, voltage data and current data may be transmitted not in a digital form but in an analog form. In yet another example, the voltage of the digital communication unit 12 may be equalized with the voltage of the monitoring IC 22 to remove the first isolator 21. In still another example, the calculator in the sixth embodiment may be installed not in the monitoring IC 22 but in the slave unit 24.

In an example, the current sensor 10 in the first to the fourth embodiments may be replaced with the current detection unit 16 in the sixth embodiment or the current detection unit 17 in the seventh embodiment. The current detection unit 16 or 17 may detect and transmit current data to each satellite unit 20 via cable. In another example, without installing the digital communication unit 12 in the current sensor 10 in the first to the fifth embodiments, output from the current sensor 10 may be digitized in the monitoring IC 22 or the slave unit 24. In yet another example, output from the current detection unit 16 or 17 in the sixth or the seventh embodiment may be digitized in the monitoring IC 22 or the slave unit 24.

In an example, the slave unit 24 in any embodiment other than the second embodiment may directly receive current data from the current sensor 10 via cable, not through the monitoring IC 22. In another example, each satellite unit 20 in any embodiment other than the second and the third embodiments may also acquire current data more frequently than voltage data and wirelessly transmit the current data to the battery ECU 30.

What is claimed is:

1. A battery monitoring system for monitoring states of battery cells connected in series so as to form a series connection of battery cells, the battery monitoring system comprising:
at least one current detection unit configured to detect a current value of the series connection of battery cells;
satellite units each associated (i) with one series connection of two or more battery cells included in the series connection of battery cells or (ii) with one of the plurality of battery cells;
voltage detection units each provided in one of the satellite units and each configured to detect a voltage value of the one series connection of two or more battery cells or the one of the plurality of battery cells;
slave units each provided in one of the satellite units and each configured to wirelessly transmit information detected by the voltage detection unit provided in the one of the satellite units;
a master unit configured to wirelessly receive the information transmitted from the slave units; and
a central monitoring unit configured to receive the information received by the master unit, wherein
each of the voltage detection units is configured to determine a frame that is synchronized with the voltage value, among signals of the current values that are output sequentially from the at least one current detection unit.

2. The battery monitoring system according to claim 1, wherein
the at least one current detection unit comprises a single current detection unit for the slave units, and
each of the slave units acquires information on the current value from the single current detection unit.

3. The battery monitoring system according to claim 1, wherein
the at least one current detection unit comprises a plurality of current detection units each associated with one of the slave units, and
each of the slave units acquires information on the current value from the current detection unit associated with the slave unit.

4. The battery monitoring system according to claim 1, wherein
each of the voltage detection units acquires information on the current value from the at least one current detection unit, and each of the slave units acquires information on the voltage value and the current value from the voltage detection unit associated with the slave unit.

5. The battery monitoring system according to claim 1, wherein
each of the slave units acquires information on the voltage value from the voltage detection unit associated with the slave unit and acquires information on the current value from the at least one current detection unit, not through the voltage detection unit associated with the slave unit.

6. The battery monitoring system according to claim 1, wherein
each of the slave units wirelessly transmits information on the current value more frequently than information on the voltage value.

7. The battery monitoring system according to claim 1, wherein
the battery monitoring system has no path for carrying information on the current value via cable from the at least one current detection unit to the central monitoring unit, and
each slave unit wirelessly transmits the information on the current value at different times from the other slave units.

8. The battery monitoring system according to claim 1, wherein
the at least one current detection unit comprises a shunt resistor connected in series to the series connection of battery cells, and
the at least one current detection unit further comprises a calculator configured to calculate the current value from a voltage difference across the shunt resistor.

9. The battery monitoring system according to claim 1, wherein
the at least one current detection unit comprises (i) a capacitor charged by being connected to one of the series connections of two or more battery cells or to one of the plurality of battery cells, thereafter the capacitor being disconnected, and (ii) a calculator configured to calculate the current value from a duration of the capacitor being charged and a voltage of the charged capacitor.

10. A battery monitoring system for monitoring states of battery cells connected in series so as to form a series connection of battery cells, the battery monitoring system comprising:
at least one current detection unit configured to detect a current value of the series connection of battery cells;
satellite units each associated (i) with one series connection of two or more battery cells included in the series connection of battery cells or (ii) with one of the plurality of battery cells;
voltage detection units each provided in one of the satellite units and each configured to detect a voltage value of the one series connection of two or more battery cells or the one of the plurality of battery cells;
slave units each provided in one of the satellite units and each configured to wirelessly transmit information detected by the voltage detection unit provided in the one of the satellite units;
a master unit configured to wirelessly receive the information transmitted from the slave units; and
a central monitoring unit configured to receive the information received by the master unit, wherein
the at least one current detection unit outputs information on the current value as a digital signal, and the battery monitoring system comprises isolators on a path carrying the digital signal, the isolators configured to transfer the digital signal while providing isolation.

11. The battery monitoring system according to claim 10, wherein
the at least one current detection unit comprises a single current detection unit for the slave units, and
each of the slave units acquires information on the current value from the single current detection unit.

12. The battery monitoring system according to claim 10, wherein
the at least one current detection unit comprises a plurality of current detection units each associated with one of the slave units, and
each of the slave units acquires information on the current value from the current detection unit associated with the slave unit.

13. The battery monitoring system according to claim 10, wherein
each of the voltage detection units acquires information on the current value from the at least one current detection unit, and
each of the slave units acquires information on the voltage value and the current value from the voltage detection unit associated with the slave unit.

14. The battery monitoring system according to claim 10, wherein
each of the slave units acquires information on the voltage value from the voltage detection unit associated with the slave unit and acquires information on the current value from the at least one current detection unit, not through the voltage detection unit associated with the slave unit.

15. The battery monitoring system according to claim 10, wherein
each of the slave units wirelessly transmits information on the current value more frequently than information on the voltage value.

16. The battery monitoring system according to claim 10, wherein
the battery monitoring system has no path for carrying information on the current value via cable from the at least one current detection unit to the central monitoring unit, and
each slave unit wirelessly transmits the information on the current value at different times from the other slave units.

17. The battery monitoring system according to claim 10, wherein
the at least one current detection unit comprises a shunt resistor connected in series to the series connection of battery cells, and
the at least one current detection unit further comprises a calculator configured to calculate the current value from a voltage difference across the shunt resistor.

18. The battery monitoring system according to claim 10, wherein
the at least one current detection unit comprises (i) a capacitor charged by being connected to one of the series connections of two or more battery cells or to one of the plurality of battery cells, thereafter the capacitor being disconnected, and (ii) a calculator configured to calculate the current value from a duration of the capacitor being charged and a voltage of the charged capacitor.

19. A battery monitoring system for monitoring a state of a battery cell, the battery monitoring system comprising:

a current detection unit configured to detect a current value of the battery cell;
a satellite unit associated with the battery cell;
a voltage detection unit provided in the satellite unit and configured to detect a voltage value of the battery cell;
a slave unit provided in the satellite unit and configured to wirelessly transmit information detected by the voltage detection unit;
a master unit configured to wirelessly receive the information transmitted from the slave unit; and
a central monitoring unit configured to receive the information received by the master unit,
wherein the voltage detection unit is configured to determine a frame that is synchronized with the voltage value, among signals of the current values that are output sequentially from the current detection unit.

20. The battery monitoring system according to claim 19, wherein
the satellite unit is configured to calculate, from the information, an internal resistance of the battery cell and to calculate, based on the calculated internal resistance, the state of the battery cell.

21. The battery monitoring system according to claim 19, wherein
the slave unit acquires information on the current value from the current detection unit.

22. The battery monitoring system according to claim 19, wherein
the voltage detection unit acquires information on the current value from the current detection unit, and
the slave unit acquires information on the voltage value and the current value from the voltage detection unit.

23. The battery monitoring system according to claim 19, wherein
the slave unit acquires information on the voltage value from the voltage detection unit and acquires information on the current value from the current detection unit, not through the voltage detection unit.

24. The battery monitoring system according to claim 19, wherein
the slave unit wirelessly transmits information on the current value more frequently than information on the voltage value.

25. The battery monitoring system according to claim 19, wherein
the current detection unit comprises a shunt resistor connected in series to the battery cell, and the current detection unit further comprises a calculator configured to calculate the current value from a voltage difference across the shunt resistor.

26. The battery monitoring system according to claim 19, wherein
the current detection unit comprises (i) a capacitor charged by being connected to the battery cell, thereafter the capacitor being disconnected, and (ii) a calculator configured to calculate the current value from a duration of the capacitor being charged and a voltage of the charged capacitor.

27. A battery monitoring system for monitoring a state of a battery cell, the battery monitoring system comprising:
a current detection unit configured to detect a current value of the battery cell;
a satellite unit associated with the battery cell;
a voltage detection unit provided in the satellite unit and configured to detect a voltage value of the battery cell;

a slave unit provided in the satellite unit and configured to wirelessly transmit information detected by the voltage detection unit;

a master unit configured to wirelessly receive the information transmitted from the slave unit; and a central monitoring unit configured to receive the information received by the master unit, wherein the current detection unit outputs information on the current value as a digital signal, and the battery monitoring system comprises isolators on a path carrying the digital signal, the isolators configured to transfer the digital signal while providing isolation.

28. The battery monitoring system according to claim 27, wherein the satellite unit is configured to calculate, from the information, an internal resistance of the battery cell and to calculate, based on the calculated internal resistance, the state of the battery cell.

29. The battery monitoring system according to claim 27, wherein the slave unit acquires information on the current value from the current detection unit.

30. The battery monitoring system according to claim 27, wherein the voltage detection unit acquires information on the current value from the current detection unit, and the slave unit acquires information on the voltage value and the current value from the voltage detection unit.

31. The battery monitoring system according to claim 27, wherein the slave unit acquires information on the voltage value from the voltage detection unit and acquires information on the current value from the current detection unit, not through the voltage detection unit.

32. The battery monitoring system according to claim 27, wherein the slave unit wirelessly transmits information on the current value more frequently than information on the voltage value.

33. The battery monitoring system according to claim 27, wherein the current detection unit comprises a shunt resistor connected in series to the battery cell, and the current detection unit further comprises a calculator configured to calculate the current value from a voltage difference across the shunt resistor.

34. The battery monitoring system according to claim 27, wherein the current detection unit comprises (i) a capacitor charged by being connected to the battery cell, thereafter the capacitor being disconnected, and (ii) a calculator configured to calculate the current value from a duration of the capacitor being charged and a voltage of the charged capacitor.

* * * * *